United States Patent
Noh

(10) Patent No.: US 8,797,797 B2
(45) Date of Patent: Aug. 5, 2014

(54) NON-VOLATILE MEMORY DEVICE, METHOD FOR FABRICATING THE SAME, AND METHOD FOR OPERATING THE SAME

(75) Inventor: Yoo-Hyun Noh, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 137 days.

(21) Appl. No.: 13/606,818

(22) Filed: Sep. 7, 2012

(65) Prior Publication Data
US 2013/0163325 A1 Jun. 27, 2013

(30) Foreign Application Priority Data

Dec. 21, 2011 (KR) .......................... 10-2011-0139636

(51) Int. Cl.
*G11C 16/10* (2006.01)
*G11C 16/04* (2006.01)
*G11C 16/34* (2006.01)

(52) U.S. Cl.
CPC ........ *G11C 16/0483* (2013.01); *G11C 16/3427* (2013.01)
USPC ............ 365/185.02; 365/185.05; 365/185.17; 365/185.18

(58) Field of Classification Search
CPC .... G11C 16/0483; G11C 16/12; G11C 16/24; G11C 16/3418; G11C 16/3427; H01L 27/11524
USPC ............ 365/185.02, 185.05, 185, 17, 185.18, 365/185.28; 257/314
See application file for complete search history.

(56) References Cited

U.S. PATENT DOCUMENTS

| 8,659,943 B2 * | 2/2014 | Lee ........................... 365/185.05 |
| 2010/0214839 A1 * | 8/2010 | Guzzi et al. .............. 365/185.17 |
| 2012/0275227 A1 * | 11/2012 | Aritome et al. .......... 365/185.17 |

FOREIGN PATENT DOCUMENTS

KR 1020120100537 9/2012

* cited by examiner

*Primary Examiner* — Tan T. Nguyen
(74) *Attorney, Agent, or Firm* — IP & T Group LLP

(57) ABSTRACT

A non-volatile memory device includes a first string and a second string that each include a first drain selection transistor, a second drain selection transistor, a plurality of memory cells, and a source selection transistor that are coupled in series in that order, respectively, a first bit line coupled with a node between the first and second drain selection transistors of the first string, and a second bit line coupled with an end node of the second string on the side of the first drain selection transistor of the second string, wherein gates of the first drain selection transistors of the first and second strings are coupled with each other, and gates of the second drain selection transistors of the first and second strings are coupled with each other.

14 Claims, 8 Drawing Sheets

NON-VOLATILE MEMORY DEVICE, METHOD FOR FABRICATING THE SAME, AND METHOD FOR OPERATING THE SAME

CROSS-REFERENCE TO RELATED APPLICATIONS

The present application claims priority of Korean Patent Application No. 10-2011-0139636, filed on Dec. 21, 2011, which is incorporated herein by reference in its entirety.

BACKGROUND

1. Field

Exemplary embodiments of the present invention relate to a semiconductor designing technology, and more particularly, to a non-volatile memory device, a method for fabricating the non-volatile memory device, and a method for operating the non-volatile memory device.

2. Description of the Related Art

Non-volatile memory devices retain data stored therein although power supply is turned off. Each memory cell of a non-volatile memory device includes a floating gate that is controlled by a control gate and performs a data program operation or a data erase operation by accumulating electrons in the floating gate or discharging the electrons out of the floating gate.

FIG. 1 is a circuit diagram illustrating a conventional non-volatile memory device, and FIG. 2 is a timing diagram describing a method for programming the non-volatile memory device shown in FIG. 1.

Referring to FIG. 1, the conventional non-volatile memory device includes a plurality of strings ST, bit lines BLe and BLo that are coupled with the one ends of the strings ST, respectively, and a source line SL that is coupled with the other ends of the strings ST in common. Each string ST includes a drain selection transistor DST, a plurality of memory cells MC, and a source selection transistor SST that are serially coupled.

The bit lines may include an even bit line BLe and an odd bit line BLo.

Gates of the drain selection transistors DST extend to one another to form a drain selection line DSL, and gates of the source selection transistors SST extend to one another to form a source selection line SSL.

Each of the memory cells MC may include a stacked structure of a floating gate and a control gate. The control gates of memory cells MC extend to one another to form a word line WL.

A program operation, which is an operation of storing a data in a selected memory cell MC, may be performed on a page basis. In particular, an even page program operation for programming a selected memory cell MC, among the memory cells MC of the strings ST coupled with the even bit lines BLe, and an odd page program operation for programming a selected memory cell MC, among the strings ST coupled with the odd bit lines BLo, are performed independently of each other. While an even page program operation is performed, the strings ST coupled with the odd bit lines BLo are kept away from being programmed, and while an odd page program operation is performed, the strings ST coupled with the even bit lines BLe are kept away from being programmed.

Hereinafter, a program operation is described in detail with reference to FIG. 2. For the description purpose, it is described that the strings ST coupled with the even bit lines BLe are programmed while the strings ST coupled with the odd bit lines BLo are not programmed.

Referring to FIG. 2, a ground voltage is applied to the even bit lines BLe as a bit line program voltage, and a voltage of approximately 3.5V is applied to the odd bit lines BLo as a bit line program inhibition voltage (refer to duration ①).

While a bit line program voltage and a bit line program inhibition voltage are applied, a bit line pre-charging is performed (refer to duration ②) by applying a voltage capable of applying both voltages to the strings ST, for example, a voltage of approximately 4V, to the drain selection line DSL.

Subsequently, a selected memory cell MC is programmed (refer to duration ④) by applying a program voltage $V_{PGM}$ and a pass voltage $V_{PASS}$ to a selected word line SEL_WL and the other word lines UNSEL_WL that are not selected.

When the programming of the selected memory cell MC is completed, all word lines WL, the drain selection line DSL, and the bit lines return to the initial states (refer to duration ⑤).

Before the pass voltage $V_{PASS}$ is applied after the bit line pre-charging is completed, in short, between the duration ② and duration ④, the voltage applied to the drain selection line DSL is decreased to such an extent that the coupling between the odd bit lines BLo and the strings ST may be substantially cut off while maintaining the coupling between the even bit lines BLe and the strings ST. For example, the voltage applied to the drain selection line DSL may be decreased to approximately 2V. This is to prevent an occurrence of a program disturbing phenomenon where the memory cell MC of an odd bit line BLo coupled with the selected word line SEL_WL is programmed by cutting off the coupling between the odd bit lines BLo and the strings ST and boosting the channel voltage of the strings ST coupled with the odd bit lines BLo.

Since the decrease extent of the voltage applied to the drain selection line DSL is to simultaneously satisfy the two conditions of maintaining the coupling between the even bit lines BLe and the strings ST and cutting off the coupling between the odd bit lines BLo and the strings ST, there is little margin. When the voltage applied to the drain selection line DSL is decreased too much, the coupling between the even bit lines BLe and the strings ST is cut off as well and thus the channels of the strings ST coupled with the even bit lines BLe may not maintain the ground voltage. Therefore, the program operation may not be performed properly. Conversely, when voltage applied to the drain selection line DSL is not decreased sufficiently, the coupling between the odd bit lines BLo and the strings ST is maintained and thus program disturbing phenomenon may occur. This is because one even bit line BLe and one odd bit line BLo share one drain selection line DSL.

SUMMARY

An embodiment of the present invention is directed to a non-volatile memory device that may secure reliability of a program operation, a method for fabricating the non-volatile memory device, and a method for operating the non-volatile memory device.

In accordance with an embodiment of the present invention, a non-volatile memory device includes: a first string and a second string that each include a first drain selection transistor, a second drain selection transistor, a plurality of memory cells, and a source selection transistor that are coupled in series in that order, respectively; a first bit line coupled with a node between the first and second drain selection transistors of the first string; and a second bit line coupled with an end node of the second string on the side of the first drain selection transistor of the second string, wherein gates of the first drain selection transistors of the first and second strings are coupled with each other, and gates of the second drain selection transistors of the first and second strings are coupled with each other.

In accordance with another embodiment of the present invention, a method for programming a non-volatile memory device having first and second strings that each includes first and second drain selection transistors, a plurality of memory cells, and a source selection transistor coupled in series includes: applying a bit line program voltage to a first bit line coupled between the first and second selection transistors of the first string and applying a bit line program inhibition voltage to a second bit line coupled to an end of the second string on the side of the first drain selection transistor of the second string; applying a first voltage for turning on the first and second drain selection transistors to gates of the first and second drain selection transistors of the first and second strings; applying a second voltage that is lower than the first voltage to the gates of the first drain selection transistors of the first and second strings to turn off the first drain selection transistor of the second string; and applying a program voltage to a word line coupled with a selected memory cell among the plurality of the memory cells, wherein a first threshold voltage of the first and second drain selection transistors of the first string is higher than a second threshold voltage of the first and second drain selection transistors of the second string.

In accordance with yet another embodiment of the present invention, a method for programming a non-volatile memory device having first and second strings that each includes first and second drain selection transistors, a plurality of memory cells, and a source selection transistor coupled in series includes: applying a bit line program inhibition voltage to a first bit line coupled between the first and second selection transistors of the first string and applying a bit line program voltage to a second bit line coupled to an end of the second string on the side of the first drain selection transistor of the second string; applying a first voltage for turning on the first and second drain selection transistors to gates of the first and second drain selection transistors of the first and second strings; applying a second voltage that is lower than the first voltage to the gates of the second drain selection transistors of the first and the second strings to maintain the second drain selection transistor of the second string to be turned on while turning off the second drain selection transistor of the first string; and applying a program voltage to a word line coupled with a selected memory cell among the plurality of the memory cells, wherein a first threshold voltage of the first and second drain selection transistors of the first string is higher than a second threshold voltage of the first and second drain selection transistors of the second string.

In accordance with still another embodiment of the present invention, a non-volatile memory device includes: a substrate including a first active region and a second active region; a first drain selection line, a second drain selection line, a plurality of word lines, and a source selection line that are disposed over the substrate and extending in a direction crossing the first and second active regions; an insulation layer formed to cover the first drain selection line, the second drain selection line, the word lines, and the source selection line; a first drain contact penetrating through the insulation layer to be coupled with the first active region between the first drain selection line and the second drain selection line; a second drain contact penetrating through the insulation layer to be coupled with the second active region on the opposite side of the first drain selection line from the side neighboring the second drain selection line; and a first bit line and a second bit line that are disposed over the insulation layer and coupled with the first drain contact and the second drain contact, respectively.

DETAILED DESCRIPTION

Figure 1:
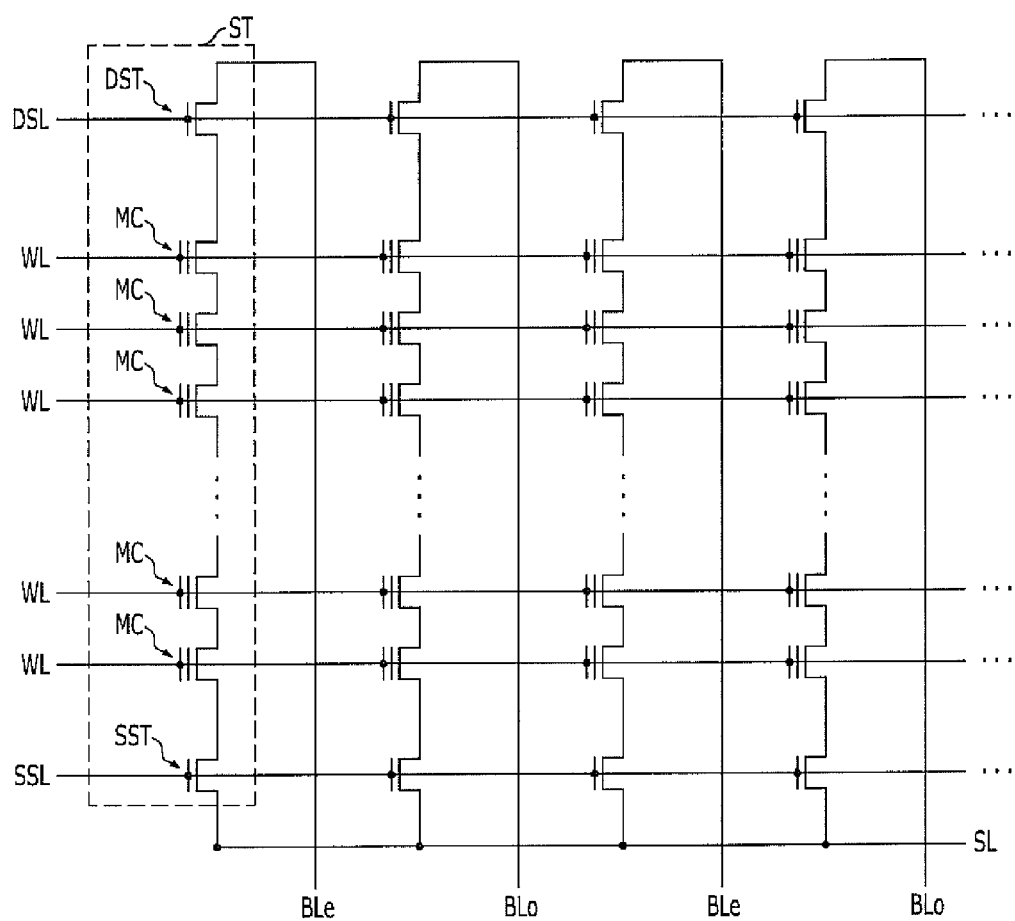
FIG. 1 is a circuit diagram illustrating a conventional non-volatile memory device.
Figure 2:
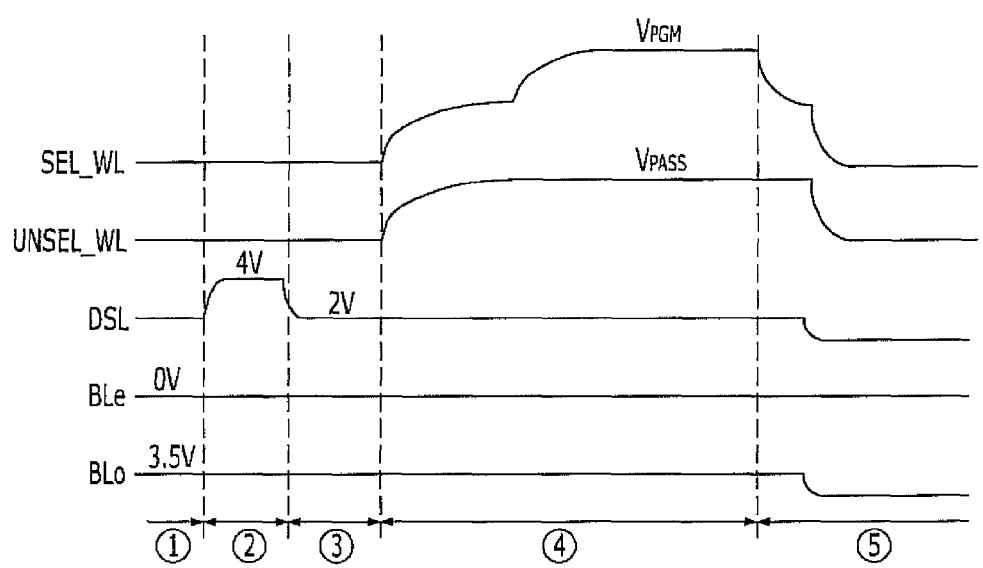
FIG. 2 is a timing diagram describing a method for programming the non-volatile memory device of FIG. 1.

Exemplary embodiments of the present invention will be described below in more detail with reference to the accompanying in drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 3:
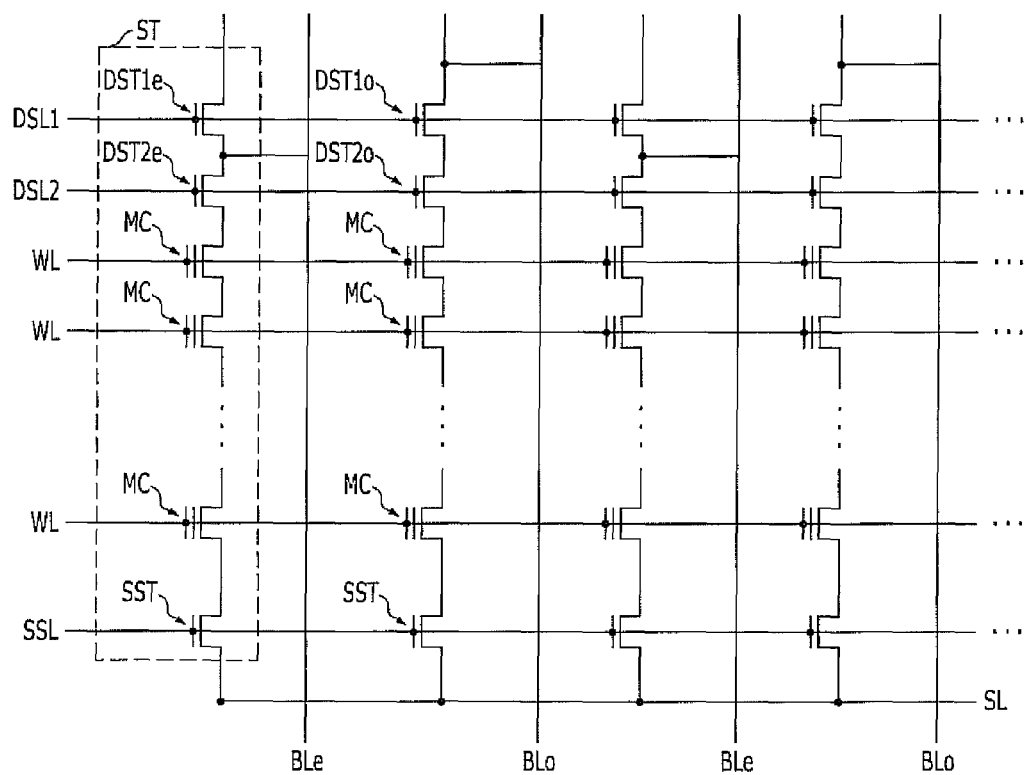
FIG. 3 is a circuit diagram of a non-volatile memory device in accordance with an embodiment of the present invention.
Figure 4A:
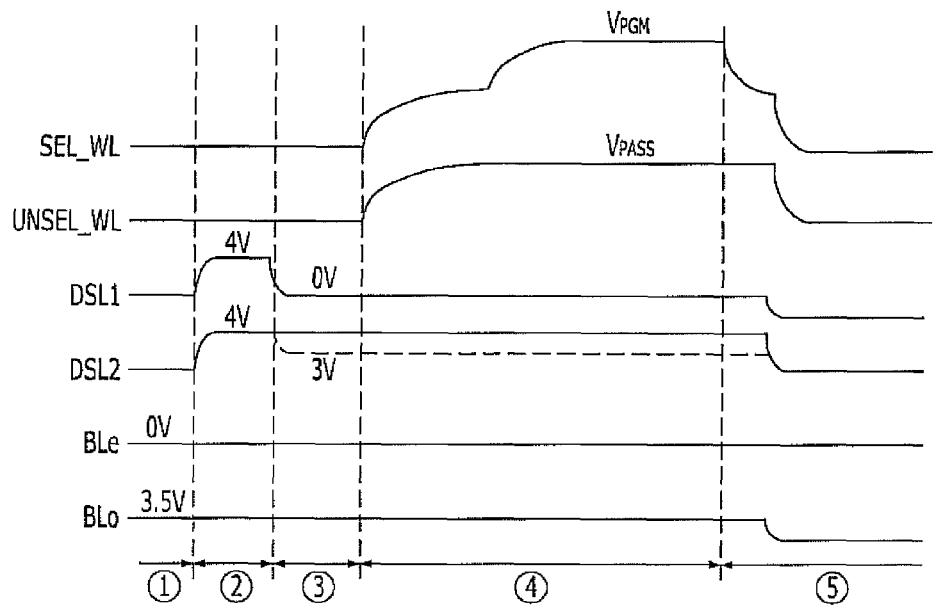
FIGS. 4A and 4B are timing diagrams describing a method for programming the non-volatile memory device of FIG. 3.
Figure 4B:
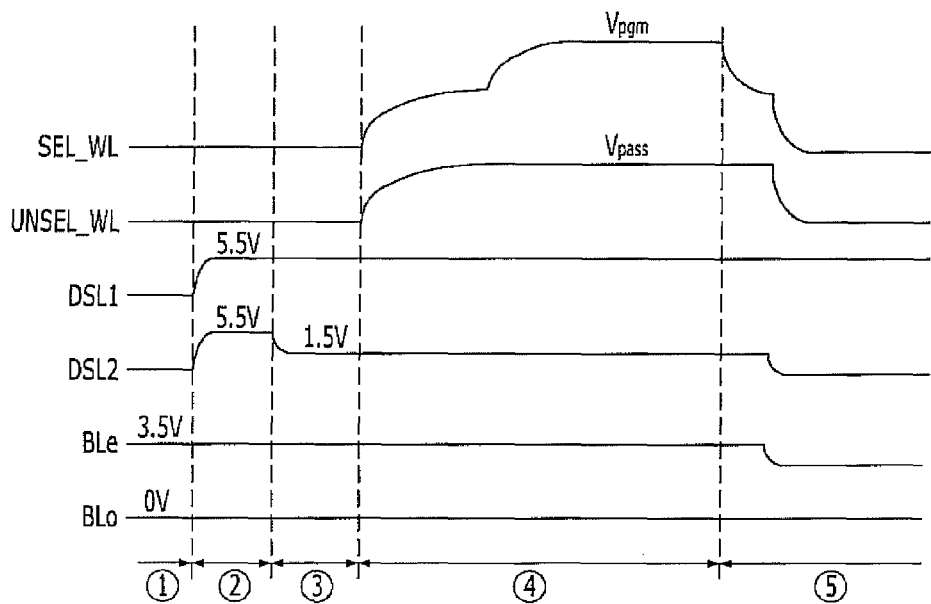

FIG. 3 is a circuit diagram of a non-volatile memory device in accordance with an embodiment of the present invention. FIGS. 4A and 4B are timing diagrams describing a method for programming the non-volatile memory device of FIG. 3. In particular, FIG. 4A illustrates an even page program method, while FIG. 4B illustrates an odd page program method.

Referring to FIG. 3, the non-volatile memory device in accordance with the embodiment of the present invention includes a plurality of strings ST, even bit lines BLe and odd bit lines BLo that are alternately arrayed and coupled with one ends of the strings ST, respectively, and a source line SL coupled with the other ends of the strings ST.

Each string ST includes a first drain selection transistor DST1e or DST1o, a second drain selection transistor DST2e or DST2o, a plurality of memory cells MC, and a source selection transistor SST that are sequentially arrayed from the side of the corresponding bit line BLe or BLo and serially coupled.

First and second drain selection transistors DST1 and DST2 of strings ST coupled with the even bit lines BLe are denoted as 'DST1e and DST2e', and first and second drain selection transistors DST1 and DST2 of strings ST coupled with the strings ST coupled with the odd bit lines BLo are denoted as 'DST1o and DST2o'.

The gates of the first drain selection transistors DST1e and DST1o extend to one another to form a first drain selection line DSL1, and the gates of the second drain selection transistors DST2e and DST2o extend to one another to form a second drain selection line DSL2. The gates of the source selection transistors SST extend to one another to form a source selection line SSL.

Each of the memory cells MC includes a floating gate and a control gate that are sequentially stacked. The control gates of the memory cells MC extend to one another to form a word line WL.

Each of the first drain selection transistor DST1e and DST1o and the second drain selection transistor DST2e and DST2o includes a drain node and a source node. The drain node is disposed at the side of the bit lines BLe and BLo, and the source node is disposed at the side of the source line SL. Since the first drain selection transistor DST1e and DST1o and the second drain selection transistor DST2e and DST2o are serially coupled, the source node of the first drain selection transistor DST1e and DST1o and the drain node of the second drain selection transistor DST2e and DST2o are in common.

The even bit lines BLe are coupled with the common node of the first even drain selection transistor DST1e and the second even drain selection transistor DST2e, which is a source node of the first even drain selection transistor DST1e and drain node of the second even drain selection transistor DST2e. On the other hand, the odd bit lines BLo are coupled with the drain node of the first odd drain selection transistor DST1o.

In this embodiment of the present invention, first threshold voltages of the first even drain selection transistor DST1e and the second even drain selection transistor DST2e are greater than second threshold voltages of the first odd drain selection transistor DST1o and the second odd drain selection transistor DST2o. Hereinafter, for the description purpose, it is described that the first threshold voltage is approximately 2V and the second threshold voltage is approximately 0.5V. The scope of the present invention, however, is not limited to it.

In the non-volatile memory device described above, a program operation of storing a data in a selected memory cell MC may be performed on a page basis. In particularly, the program operation may include an even page program operation of programming the selected memory cell MC among the memory cells MC of the strings ST coupled with the even bit lines BLe and an odd page program operation of programming the selected memory cell MC among the memory cells MC of the strings ST coupled with the odd bit lines BLo. While the even page program operation is performed, the strings ST coupled with the odd bit lines BLo are kept away from being programmed, and while the odd page program operation is performed, the strings ST coupled with the even bit lines BLe are kept away from being programmed.

Hereinafter, the even page program operation and the odd page program operation are described in detail with reference to FIGS. 4A and 4B, respectively.

Referring to FIG. 4A, first, a bit line program voltage is applied to the even bit lines BLe and a bit line program inhibition voltage is applied to the odd bit lines BLo (refer to duration ①). The bit line program voltage is sufficiently lower than a program voltage that is applied to a control gate of the selected memory cell MC so that the selected memory cell MC is programmed. In this embodiment, it is described that the bit line program voltage is approximately 0V. On the contrary, the bit line program inhibition voltage is a relatively high positive voltage for inhibiting an unselected memory cell MC sharing a word line WL with the selected memory cell MC from being programmed. In this embodiment, it is described that the bit line program inhibition voltage is approximately 3.5V.

Subsequently, a first voltage for turning on all of the first drain selection transistor DST1e and DST1o and the second drain selection transistor DST2e and DST2o is applied to the first and second drain selection lines DSL1 and DSL2 in order to transfer the bit line program voltage and the bit line program inhibition voltage to the strings ST (refer to duration ②).

In order to turn on all of the first and second even drain selection transistors DST1e and DST2e coupled with the even bit lines BLe, the first voltage is to be equal to or higher than the sum of the first threshold voltage of the first and second even drain selection transistors DST1e and DST2e and the bit line program voltage applied to the even bit lines BLe. Also, in order to turn on all of the first and second odd drain selection transistors DST1o and DST2o coupled with the odd bit lines BLo, the first voltage is to be equal to or higher than the sum of the second threshold voltage of the first and second odd drain selection transistors DST1o and DST2o and the bit line program inhibition voltage applied to the odd bit lines BLo. In this embodiment, it is described that the first threshold voltage is approximately 2V, the bit line program voltage is approximately 0V, the second threshold voltage is approximately 0.5V, and the bit line program inhibition voltage is approximately 3.5V. Therefore, the first voltage is to be equal to or higher than approximately 4V (=0.5V+3.5V).

Subsequently, before a pass voltage $V_{PASS}$ and a program voltage $V_{PGM}$ are applied (refer to duration ④), the first voltage applied to the first drain selection line DSL1 is decreased (refer to duration ③) to turn off the first odd drain selection transistor DST1o and cut off the coupling between the odd bit lines BLo and the corresponding strings ST. The decreased voltage is referred to as a second voltage, hereinafter.

To turn off the first odd drain selection transistor DST1o, the second voltage is to be lower than the sum of the bit line program inhibition voltage, which is approximately 3.5V, and the second threshold voltage, which is approximately 0.5V. The second voltage does not have a lower limit. This is because the even bit lines BLe are coupled with the drain node of the second even drain selection transistor DST2e and the even bit lines BLe may be coupled with the corresponding string ST regardless of whether the first even drain selection transistor DST1e turns on or not. In short, although the second voltage applied to the first drain selection line DSL1 is so low that the first even drain selection transistor DST1e is turned off, the coupling between the even bit lines BLe and the corresponding strings ST is maintained and a proper program operation is performed as long as the second even drain selection transistor DST2e keeps turning on. Therefore, the odd bit lines BLo may be completely disconnected from the corresponding strings ST by sufficiently lowering the second voltage that is applied to the first drain selection line DSL1. Although the second voltage is described to be approximately 0V in this embodiment, the second voltage may have any value as long as the second voltage is lower than approximately 4V.

Meanwhile, as described above, the second even drain selection transistor DST2e is to maintain the turn-on state for coupling between the even bit lines BLe and the corresponding strings ST in the duration ③. Therefore, the first voltage applied to the second drain selection line DSL2 may be maintained at approximately 4V. However, the first voltage applied to the second drain selection line DSL2 may be slightly decreased as long as the second even drain selection transistor DST2e may maintain the turn-on state. The decreased voltage is referred to as a third voltage, hereinafter. The third voltage is more than the sum of the bit line program voltage, which is approximately 0V, and the first threshold voltage, which is approximately 2V. Although the third voltage is approximately 3V in this embodiment, the scope of the present invention is not limited to the specific value.

Subsequently, the selected memory cell MC is programmed (refer to duration ④) by applying a program voltage $V_{PGM}$ to a word line coupled with the selected memory cell MC, which is referred to as a selected word line SEL_WL, and applying a pass voltage $V_{PASS}$ to the other unselected word lines UNSEL_WL. To be specific, the voltages applied to the selected word line SEL_WL and the unselected word lines UNSEL_WL are raised up to the pass voltage $V_{PASS}$, and then the pass voltage $V_{PASS}$ applied to the selected word line SEL_WL is further increased up to the program voltage $V_{PGM}$. Accordingly, the selected memory cell MC is programmed while the program voltage $V_{PGM}$ is applied.

Although a high positive voltage such as the program voltage $V_{PGM}$ is applied to the selected word line SEL_WL, the coupling between the odd bit lines BLo and the corresponding strings ST is cut off to boost a channel voltage. Therefore, the unselected memory cells MC that are included in the strings ST coupled with the odd bit lines BLo and coupled with the selected word line SEL_WL may be inhibited from being programmed.

Subsequently, when the programming of the selected memory cell MC is completed, all the word lines WL, the first and second drain selection lines DSL1 and DSL2, and the bit lines BLe and BLo go back to the initial state (refer to duration ⑤).

According to the even page programming method described above, since the voltage applied to the first drain selection line DSL1 may be sufficiently decreased, the odd bit lines BLo and the corresponding strings ST may be completely cut off, thus preventing the occurrence of program disturbing phenomenon. Since sufficient decrease in the voltage of the first drain selection line DSL1 does not affect the coupling between the even bit lines BLe and the corresponding strings ST, an even page program operation may be performed properly. Furthermore, since the voltages applied to the first drain selection line DSL1, the second drain selection line DSL2, and adjacent word lines WL during a program operation have sequential values of 0V, 4V, and the pass voltage $V_{PASS}$, Hot Carrier Injection (HCI) phenomenon caused by a great voltage difference between the drain selection transistors and the adjacent memory cells may be prevented from occurring.

Referring to FIG. 4B, conversely, the bit line program inhibition voltage, for example, approximately 3.5V, is applied to the even bit lines BLe, and a bit line program voltage, for example, approximately 0V, is applied to the odd bit lines BLo (refer to duration ①).

Subsequently, the first voltage that may completely turn on all of the first drain selection transistor DST1e and DST1o and the second drain selection transistor DST2e and DST2o is applied to the first drain selection line DSL1 and the second drain selection line DSL2 in order to transfer the bit line program voltage and the bit line program inhibition voltage to the strings ST (refer to duration ②).

In order to completely turn on all of the first even drain selection transistor DST1e and the second even drain selection transistor DST2e that are coupled with the even bit lines BLe, the first voltage is to be equal to or higher than the sum of the first threshold voltage of the first even drain selection transistor DST1e and the second even drain selection transistor DST2e and the bit line program inhibition voltage applied to the even bit lines BLe. Also, in order to completely turn on all of the first odd drain selection transistor DST1o and the second odd drain selection transistor DST2o that are coupled with the odd bit lines BLo, the first voltage is to be equal to or higher than the sum of the second threshold voltage of the first odd drain selection transistor DST1o and the second odd drain selection transistor DST2o and the bit line program voltage applied to the odd bit lines BLo. In this embodiment of the present invention, the first threshold voltage is approximately 2V, the bit line program inhibition voltage is approximately 3.5V, the second threshold voltage is approximately 0.5V, and the bit line program voltage is approximately 0V. Thus, the first voltage is to have a value of approximately 5.5V (=2V+3.5V)

Subsequently, before the pass voltage $V_{PASS}$ and the program voltage $V_{PGM}$ are applied (refer to duration ④), the first voltage applied to the second drain selection line DSL2 is decreased to turn off the second even drain selection transistor DST2e and thus cut off the coupling between the even bit lines BLe and the corresponding strings ST. Since the coupling between the odd bit lines BLo and the corresponding strings ST is to be maintained, the first voltage is decreased as long as the second odd drain selection transistor DST2o maintains the turn-on state (refer to duration ③). The decreased voltage is referred to as a second voltage, hereinafter.

To turn off the second even drain selection transistor DST2e, the second voltage is to be lower than the sum of the bit line program inhibition voltage, which is approximately 3.5V, and the first threshold voltage, which is approximately 2V. At the same time, to turn on the second odd drain selection transistor DST2o, the second voltage is to be higher than the sum of the bit line program voltage, which is approximately 0V, and the second threshold voltage, which is approximately 0.5V. In short, the second voltage may range from the sum of the bit line program voltage and the second threshold voltage to the sum of the bit line program inhibition voltage and the first threshold voltage. Therefore, as the level of the first threshold voltage is increased compared with the second threshold voltage, the range of the second voltage becomes wide. In this embodiment of the present invention, the second voltage is approximately 1.5V, but the second voltage may have a value lower than approximately 5.5V and equal to or higher than 0.5V.

It is obvious that the first odd drain selection transistor DST1o is to maintain the turn-on state for coupling between the odd bit lines BLo and the corresponding strings ST in the duration ③. Therefore, the first voltage applied to the first drain selection line DSL1 may be maintained at approximately 5.5V. However, the first voltage that is applied to the first drain selection line DSL1 may be slightly decreased or increased as long as the first odd drain selection transistor DST1o maintains the turn-on state. The voltage applied to the first drain selection line DSL1 does not affect the coupling between the even bit lines BLe and the corresponding strings ST, as described before.

Subsequently, the selected memory cell MC is programmed by applying the program voltage $V_{PGM}$ to the selected word line SEL_WL and applying the pass voltage $V_{PASS}$ to the other unselected word lines UNSEL_WL (refer to duration ④).

Although a high positive voltage such as the program voltage $V_{PGM}$ is applied to the selected word line SEL_WL, the coupling between the even bit lines BLe and the corresponding strings ST is cut off and a channel voltage is boosted.

Therefore, the unselected memory cells MC that are included in the strings ST of the even bit lines BLe and coupled with the selected word line SEL_WL may be inhibited from being programmed.

Subsequently, when the programming of the selected memory cell MC is completed, all of the word lines WL, the first drain selection line DSL1, the second drain selection line DSL2, and the bit lines BLe and BLo go back to the initial state (refer to duration ⑤).

In the odd page programming method described above, the range of the voltage that may be applied to the second drain selection line DSL2 may be increased by increasing the difference between the second threshold voltage and the first threshold voltage while the even bit lines BLe and the corresponding strings ST are completely cut off to prevent the occurrence of program disturbing phenomenon. Also, the voltage of the first drain selection line DSL1 may not be decreased to maintain the coupling between the odd bit lines BLo and the corresponding strings ST since there is no influence on the coupling between the even bit lines BLe and the corresponding strings ST. Therefore, the odd page program operation may be properly performed.

Figure 5:
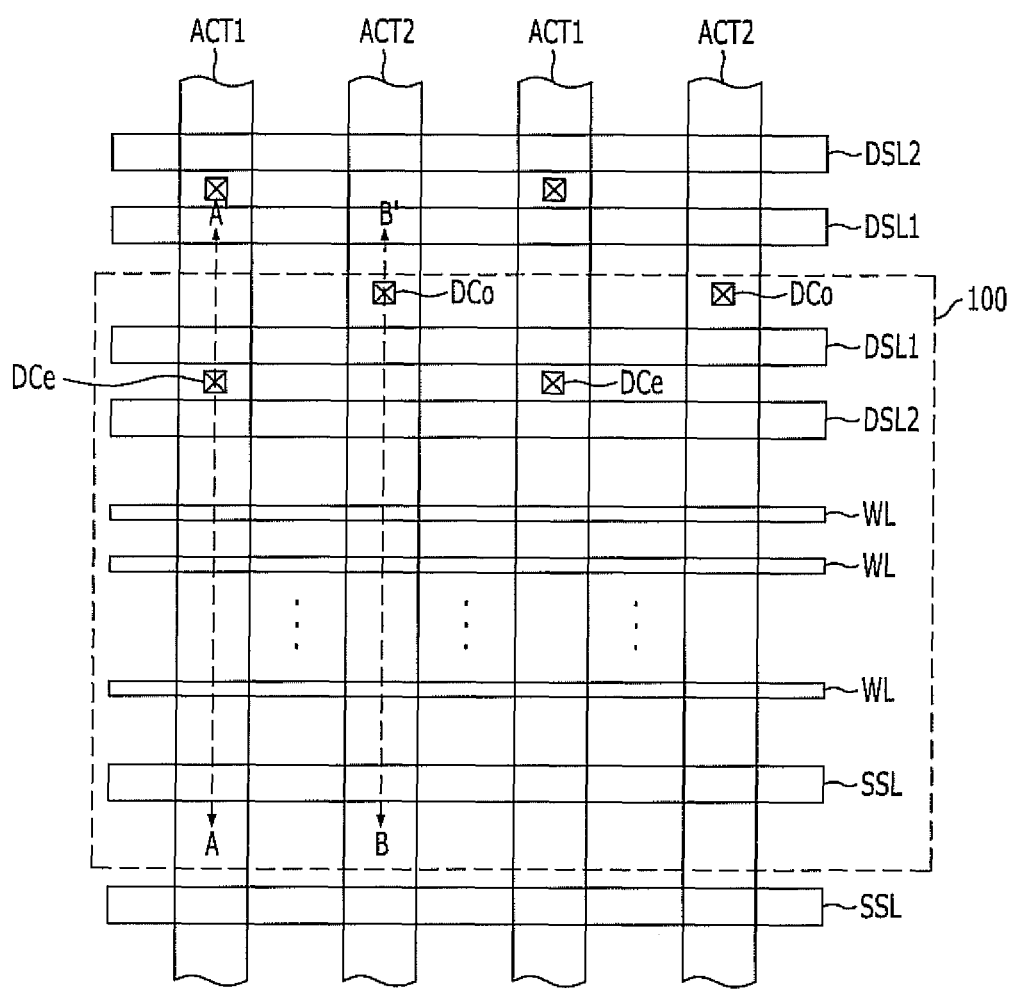
FIG. 5 is a plan view of a non-volatile memory device in accordance with the embodiment of the present invention.
Figure 6A:
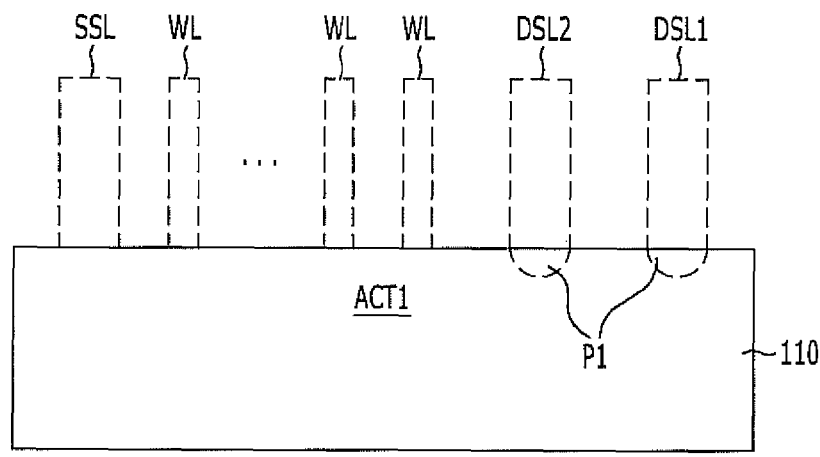
FIGS. 6A to 8B are cross sectional views describing a non-volatile memory device and a method for fabricating the non-volatile memory device in accordance with the embodiment of the present invention.
Figure 7A:
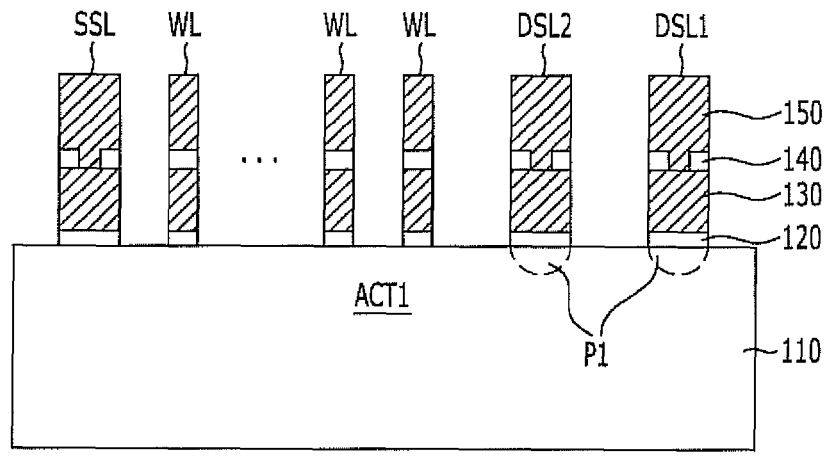
Figure 7B:
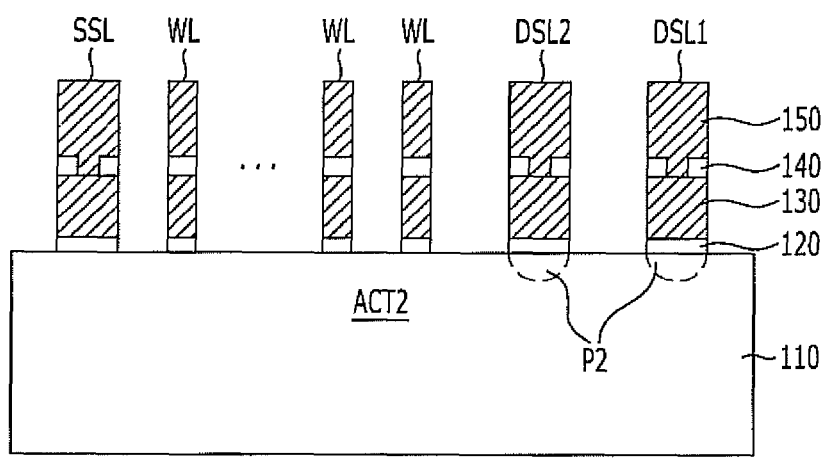
Figure 8A:
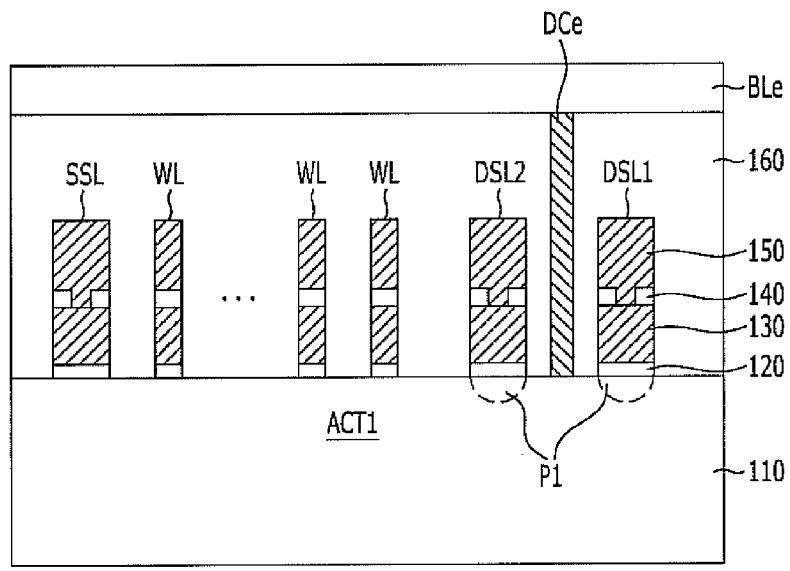
Figure 8B:
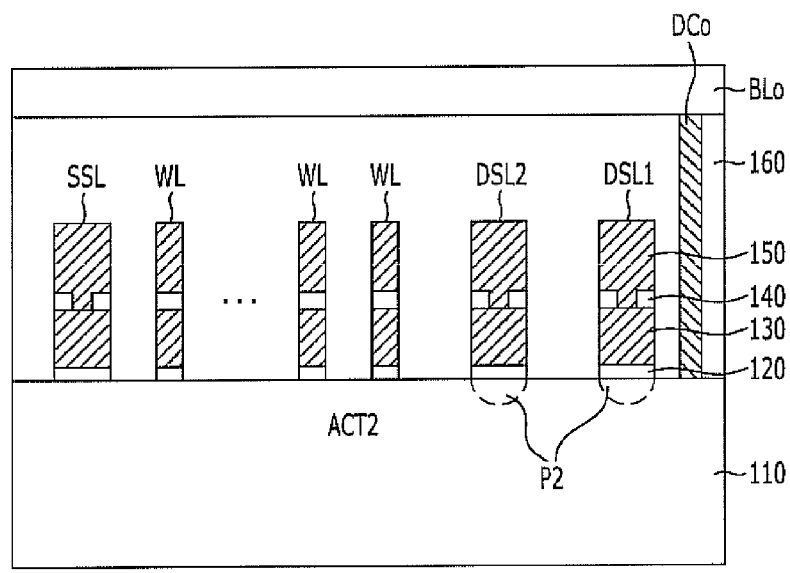

FIG. 5 is a plan view of a non-volatile memory device in accordance with the embodiment of the present invention. The circuit diagram of FIG. 3 is an equivalent circuit diagram of a memory block 100 shown in FIG. 5. FIGS. 6A to 8B are cross-sectional views describing a non-volatile memory device and a method for fabricating the non-volatile memory device in accordance with the embodiment of the present invention. FIGS. 6A, 7A and 8A show cross-sections of the non-volatile memory device of FIG. 5 taken along a line A-A', and FIGS. 6B, 7B and 8B show cross-sections of the non-volatile memory device of FIG. 5 taken along a line B-B'.

First, a method for fabricating the non-volatile memory device is described.

Figure 6B:
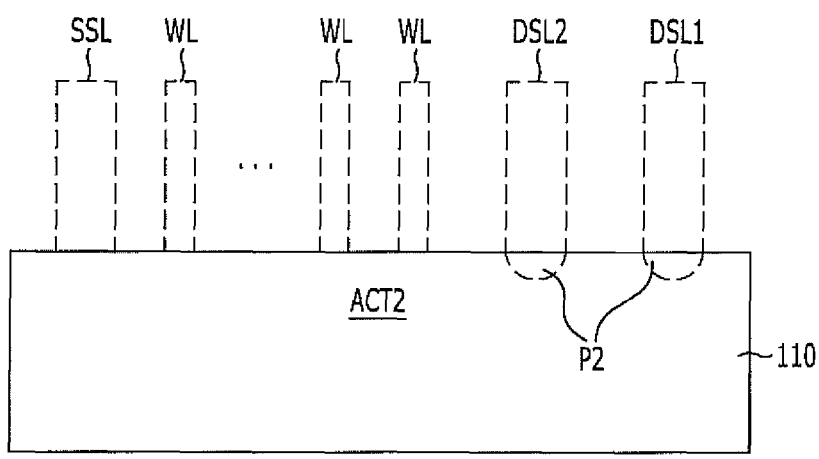

Referring to FIGS. 5, 6A and 6B, active regions ACT1 and ACT2 of a substrate 110 are defined by forming an isolation layer over the substrate 110 through a Shallow Trench Isolation (STI) process. The active regions ACT1 and ACT2 have a shape of line extending in one direction, and a plurality of active regions are arrayed in parallel. For the description purposes, an active region to be coupled with the even bit lines BLe that are to be formed in a subsequent process is referred to as a first active region ACT1, and another active region to be coupled with the odd bit lines BLo is referred to as a second active region ACT2. The first active region ACT1 and the second active region ACT2 may be alternately arrayed.

Subsequently, before the first drain selection line DSL1, the second drain selection line DSL2, the word lines WL, and the source selection line SSL are formed over the substrate 110, a first impurity doping region P1 is formed by doping a first impurity to the first active region ACT1 on which the first drain selection line DSL1 and the second drain selection line DSL2 are to be formed, and a second impurity doping region P2 is formed by doping a second impurity to the second active region ACT2 on which the first drain selection line DSL1 and the second drain selection line DSL2 are to be formed. The impurity may be implanted through a mask process for exposing a portion to be doped with the impurity and an ion implantation process performed into the exposed portion.

The first and second impurities of the first impurity doping region P1 and the second impurity doping region P2 may be an N-type impurity, such as boron (B), and the doping concentrations may be different. For example, the doping concentration in the first impurity doping region P1 may be higher than the doping concentration in the second impurity doping region P2. The first impurity doping region P1 and the second impurity doping region P2 may have different doping concentrations to make the first and second drain selection transistors to be formed in the first active region ACT1 and the first and second drain selection transistors to be formed in the second active region ACT2 have different threshold voltages. The N-type impurity, such as boron (B), is known to increase a threshold voltage of a transistor as being doped highly. Therefore, the threshold voltage of the first and second drain selection transistors to be formed in the first active region ACT1 may be increased by raising the doping concentration in the first impurity doping region P1 higher than the doping concentration in the second impurity doping region P2.

Referring to FIGS. 5, 7A and 7B, a tunnel insulation layer, a conductive layer for forming a floating gate, an inter-gate dielectric layer, and a conductive layer for forming a control gate are sequentially deposited over the substrate 110. Subsequently, the first drain selection line DSL1, the second drain selection line DSL2, the word lines WL, and the source selection line SSL each of which includes a stack of a tunnel insulation layer pattern 120, a floating gate 130, an inter-gate dielectric layer pattern 140, and a control gate 150 are formed by patterning the tunnel insulation layer, the conductive layer for forming a floating gate, the inter-gate dielectric layer, and the conductive layer for forming a control gate.

In the first drain selection line DSL1, the second drain selection line DSL2, and the source selection line SSL, an inter-gate dielectric layer is further patterned to have a portion or the entire of the inter-gate dielectric layer removed, before the conductive layer for forming a control gate is deposited. As a result, the floating gate 130 and the control gate 150 are electrically connected in the first drain selection line DSL1, the second drain selection line DSL2, and the source selection line SSL.

Also, the control gate 150 has the same planar shape as that of the first drain selection line DSL1, the second drain selection line DSL2, the word lines WL, and the source selection line SSL. In short, the control gate 150 has a shape of line crossing the active regions ACT1 and ACT2. On the contrary, the floating gate 130 is formed in the overlap portion of the control gate 150 and the active regions ACT1 and ACT2 to have a shape of islands.

Referring to FIGS. 5, 8A and 8B, an inter-layer dielectric layer 160 that covers the first drain selection line DSL1, the second drain selection line DSL2, the word lines WL, and the source selection line SSL is formed over the substrate 110.

Subsequently, a contact hole that exposes the area between the first drain selection line DSL1 and the second drain selection line DSL2 of the first active region ACT1 and a contact hole that exposes a drain region of the first drain selection transistor DST1 of the second active region ACT2, that is, the second active region ACT2 on the one side of the first drain selection line DSL1, which is not neighboring the second drain selection line DSL2 between both sides of the first drain selection line DSL1, are formed by selectively etching the inter-layer dielectric layer 160. Subsequently, a first drain contact DCe that is coupled with a portion of the first active region ACT1 and a second first drain contact DCo that is coupled with a portion of the second active region ACT2 are formed by filling the contact holes with a conductive material.

Subsequently, the even bit lines BLe coupled with a portion of the first active region ACT1 through the first drain contact DCe and the odd bit lines BLo coupled with a portion of the second active region ACT2 through the second drain contact DCo are formed by depositing and patterning a conductive material over the inter-layer dielectric layer 160. The even bit lines BLe and the odd bit lines BLo may extend in the same direction as the active regions ACT1 and ACT2 extend.

Although not illustrated in the drawings, the active regions ACT1 and ACT2 on the one side of the source selection line SSL, which is not neighboring the word lines WL between both sides of the source selection line SSL, may be coupled with a source line through a source contact. The source line extends in a direction crossing the bit lines BLe and BLo, and the source line may be disposed on a different layer from the layer where the bit lines BLe and BLo are disposed.

The non-volatile memory device shown in FIGS. 5, 8A and 8B may be fabricated through the process described above. Since the non-volatile memory device is substantially the same as the non-volatile memory device shown in the circuit diagram of FIG. 3, program operation reliability may be secured as well. Moreover, since the first drain contact DCe and the second drain contact DCo are not disposed on a straight line but arrayed in different positions alternately, the non-volatile memory device shown in FIGS. 5, 8A and 8B may secure the distance between drain contacts.

Although the non-volatile memory device, the method for fabricating the same, and the method for operating the same are described above in accordance with the embodiment of the present invention, the scope of the present invention is not limited to it.

For example, the arrangement order of the even bit lines BLe and the odd bit lines BLo in this embodiment may be changed. Also, the even bit lines BLe may be coupled with a drain node of a drain selection transistor on the side of the bit lines, and the odd bit lines BLo may be coupled with a common node of two drain selection transistors.

According to an embodiment of the present invention, a non-volatile memory device, a method for fabricating the non-volatile memory device, and a method for operating the non-volatile memory device may secure reliability of a program operation.

While the present invention has been described with respect to the specific embodiments, it will be apparent to those skilled in the art that various changes and modifications may be made without departing from the spirit and scope of the invention as defined in the following claims.

What is claimed is:

1. A non-volatile memory device, comprising:
   a first string and a second string that each include a first drain selection transistor, a second drain selection transistor, a plurality of memory cells, and a source selection transistor that are coupled in series in that order, respectively;
   a first bit line coupled with a node between the first and second drain selection transistors of the first string; and
   a second bit line coupled with an end node of the second string on the side of the first drain selection transistor of the second string,
   wherein gates of the first drain selection transistors of the first and second strings are coupled with each other, and gates of the second drain selection transistors of the first and second strings are coupled with each other.

2. The non-volatile memory device of claim 1, wherein a first threshold voltage of the first and second drain selection transistors of the first string is higher than a second threshold voltage of the first and second drain selection transistors of the second string.

3. A method for programming a non-volatile memory device having first and second strings that each includes first and second drain selection transistors, a plurality of memory cells, and a source selection transistor coupled in series, the method comprising:
   applying a bit line program voltage to a first bit line coupled between the first and second selection transistors of the first string and applying a bit line program inhibition voltage to a second bit line coupled to an end of the second string on the side of the first drain selection transistor of the second string;
   applying a first voltage for turning on the first and second drain selection transistors to gates of the first and second drain selection transistors of the first and second strings;
   applying a second voltage that is lower than the first voltage to the gates of the first drain selection transistors of the first and second strings to turn off the first drain selection transistor of the second string; and
   applying a program voltage to a word line coupled with a selected memory cell among the plurality of the memory cells,
   wherein a first threshold voltage of the first and second drain selection transistors of the first string is higher than a second threshold voltage of the first and second drain selection transistors of the second string.

4. The method of claim 3, wherein the first voltage is equal to or higher than a sum of the bit line program inhibition voltage and the second threshold voltage, and
   the second voltage is lower than the sum of the bit line program inhibition voltage and the second threshold voltage.

5. The method of claim 3, further comprising:
   applying a third voltage that is equal to or lower than the first voltage to the gates of the second drain selection transistors of the first and second strings to maintain the second drain selection transistor of the first string to be turned on, after the applying of the first voltage and before the applying of the program voltage.

6. The method of claim 5, wherein the third voltage is equal to or higher than a sum of the bit line program voltage and the first threshold voltage.

7. A method for programming a non-volatile memory device having first and second strings that each includes first and second drain selection transistors, a plurality of memory cells, and a source selection transistor coupled in series, the method comprising:
   applying a bit line program inhibition voltage to a first bit line coupled between the first and second selection transistors of the first string and applying a bit line program voltage to a second bit line coupled to an end of the second string on the side of the first drain selection transistor of the second string;
   applying a first voltage for turning on the first and second drain selection transistors to gates of the first and second drain selection transistors of the first and second strings;
   applying a second voltage that is lower than the first voltage to the gates of the second drain selection transistors of the first and second strings to maintain the second drain selection transistor of the second string to be turned on while turning off the second drain selection transistor of the first string; and
   applying a program voltage to a word line coupled with a selected memory cell among the plurality of the memory cells,
   wherein a first threshold voltage of the first and second drain selection transistors of the first string is higher than a second threshold voltage of the first and second drain selection transistors of the second string.

8. The method of claim 7, wherein the first voltage is equal to or higher than a sum of the bit line program inhibition voltage and the first threshold voltage, and
   the second voltage is lower than the sum of the bit line program inhibition voltage and the first threshold voltage and equal to or higher than a sum of the bit line program voltage and the second threshold voltage.

9. A non-volatile memory device, comprising:
a substrate including a first active region and a second active region;
a first drain selection line, a second drain selection line, a plurality of word lines, and a source selection line that are disposed over the substrate and extending in a direction crossing the first and second active regions;
an insulation layer formed to cover the first drain selection line, the second drain selection line, the word lines, and the source selection line;
a first drain contact penetrating through the insulation layer to be coupled with the first active region between the first drain selection line and the second drain selection line;
a second drain contact penetrating through the insulation layer to be coupled with the second active region on the opposite side of the first drain selection line from the side neighboring the second drain selection line; and
a first bit line and a second bit line that are disposed over the insulation layer and coupled with the first drain contact and the second drain contact, respectively.

10. The non-volatile memory device of claim 9, wherein an impurity doping concentration of the first active region that the first and second drain selection lines are disposed on is different from an impurity doping concentration of the second active region that the first and second drain selection lines are disposed on.

11. The non-volatile memory device of claim 10, wherein an N-type impurity is implanted in the first and second active regions, and the doping concentration of the first active region is higher than the doping concentration of the second active region.

12. The non-volatile memory device of claim 9, wherein each of the first drain selection line, the second drain selection line, the word lines, and the source selection line includes a stacked structure of a tunnel insulation layer, a first conductive layer for forming a floating gate, an inter-gate dielectric layer, and a second conductive layer for forming a control gate, and
a portion or the entirety of the inter-gate dielectric layer of the first drain selection line, the second drain selection line, and the source selection line is removed.

13. The non-volatile memory device of claim 12, wherein the stacked structures of the first and second drain selection lines form gates of first and second drain transistors, respectively, and first and second drain selection transistors of the first active region have a first threshold voltage higher than a second threshold voltage of first and second drain selection transistors of the second active region.

14. The non-volatile memory device of claim 9, wherein a plurality of first regions, operating as the first active region, are arrayed alternately with a plurality of second regions as the second active region, and the first drain contact and the second drain contact are disposed on different lines crossing the first and second active regions.

\* \* \* \* \*